United States Patent
Tokuda et al.

(10) Patent No.: US 7,736,941 B2
(45) Date of Patent: Jun. 15, 2010

(54) LIGHT OR RADIATION DETECTOR MANUFACTURING METHOD

(75) Inventors: Satoshi Tokuda, Kyoto (JP); Tamotsu Okamoto, Kisarazu (JP)

(73) Assignees: Shimadzu Corporation, Kyoto (JP); Institute of National Colleges of Technology, Japan, Tokyo (JP)

(*) Notice: Subject to any disclaimer, the term of this patent is extended or adjusted under 35 U.S.C. 154(b) by 0 days.

(21) Appl. No.: 12/441,312

(22) PCT Filed: Apr. 12, 2007

(86) PCT No.: PCT/JP2007/058064
§ 371 (c)(1),
(2), (4) Date: Mar. 13, 2009

(87) PCT Pub. No.: WO2008/032461
PCT Pub. Date: Mar. 20, 2008

(65) Prior Publication Data
US 2010/0029037 A1    Feb. 4, 2010

(30) Foreign Application Priority Data
Sep. 14, 2006   (JP) .............................. 2006-249736

(51) Int. Cl.
*H01L 21/20* (2006.01)
(52) U.S. Cl. .................... 438/97; 438/503; 438/507
(58) Field of Classification Search .............. 438/97, 438/503, 507, 57, 59–62
See application file for complete search history.

(56) References Cited
U.S. PATENT DOCUMENTS
5,994,642 A  11/1999  Higuchi et al.

6,344,370 B1  2/2002  Izumi et al.
2005/0082495 A1  4/2005  Nakano et al.

FOREIGN PATENT DOCUMENTS
JP  08-078707 A  3/1996

(Continued)

OTHER PUBLICATIONS

Bonnet, Dieter. "Manufacturing of CSS CdTe solar cells", 2000, Thin Solid Films, 361-362, pp. 547-552.*

(Continued)

*Primary Examiner*—Walter L Lindsay, Jr.
*Assistant Examiner*—Reema Patel
(74) *Attorney, Agent, or Firm*—Cheng Law Group, PLLC

(57) ABSTRACT

In a light or radiation detector manufacturing method and a light or radiation detector of this invention, when forming a semiconductor, the semiconductor is formed in a predetermined thickness on a dummy substrate by vapor deposition, subsequently the dummy substrate is replaced with a graphite substrate which is a supporting substrate, and the semiconductor continues to be formed on the graphite substrate by vapor deposition. The time when forming the semiconductor in the predetermined thickness on the dummy substrate by vapor deposition is an initial state, and a defective film inevitably to be formed is formed on the dummy substrate. Subsequently, a semiconductor not in the initial state is formed on the graphite substrate put as replacement. This realizes a detector having the semiconductor of higher quality than in the prior art. The semiconductor manufactured in this way is formed continuously at least in a direction of thickness.

10 Claims, 7 Drawing Sheets

FOREIGN PATENT DOCUMENTS

| | | |
|---|---|---|
| JP | 10-303441 A | 11/1998 |
| JP | 11-074551 A | 3/1999 |
| JP | 11-152564 A | 6/1999 |
| JP | 2000-307091 A | 11/2000 |
| JP | 2000-357810 A | 12/2000 |
| JP | 2001-102602 A | 4/2001 |
| JP | 2004-138472 A | 5/2004 |
| JP | 2005-127730 A | 5/2005 |
| JP | 2005-298894 A | 10/2005 |

OTHER PUBLICATIONS

International Search Report for the Application No. PCT/JP2007/058064 mailed May 22, 2007.

Nakai, Yasuo, "Handbook of Thin Film Formation/Evaluation and its Application Technology", Fuji Technosystem, p. 250.

* cited by examiner

Fig. 3
(a)
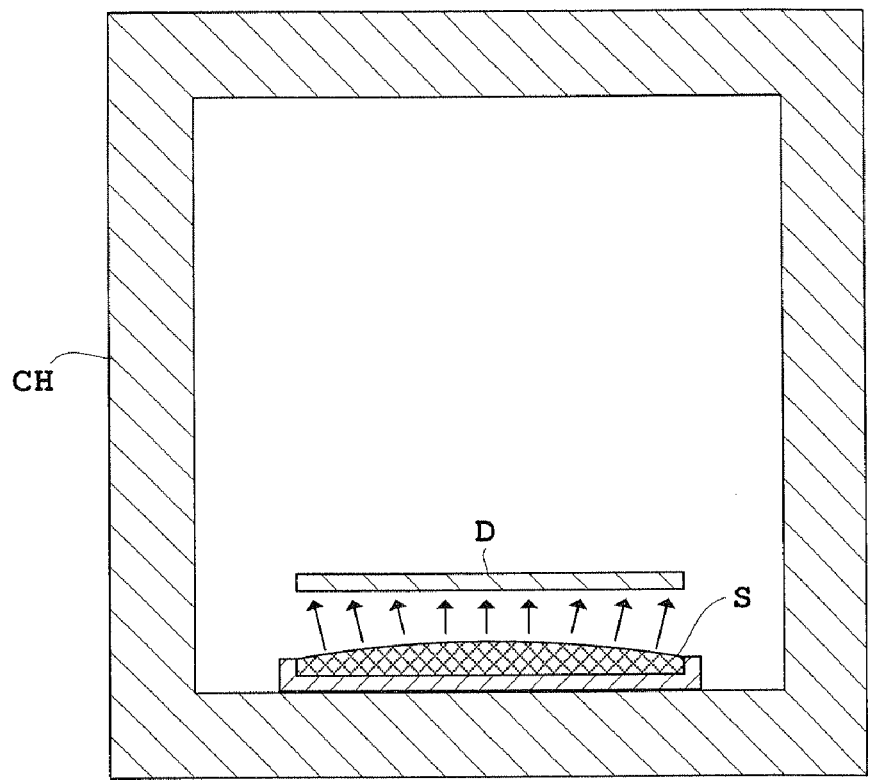
(b)
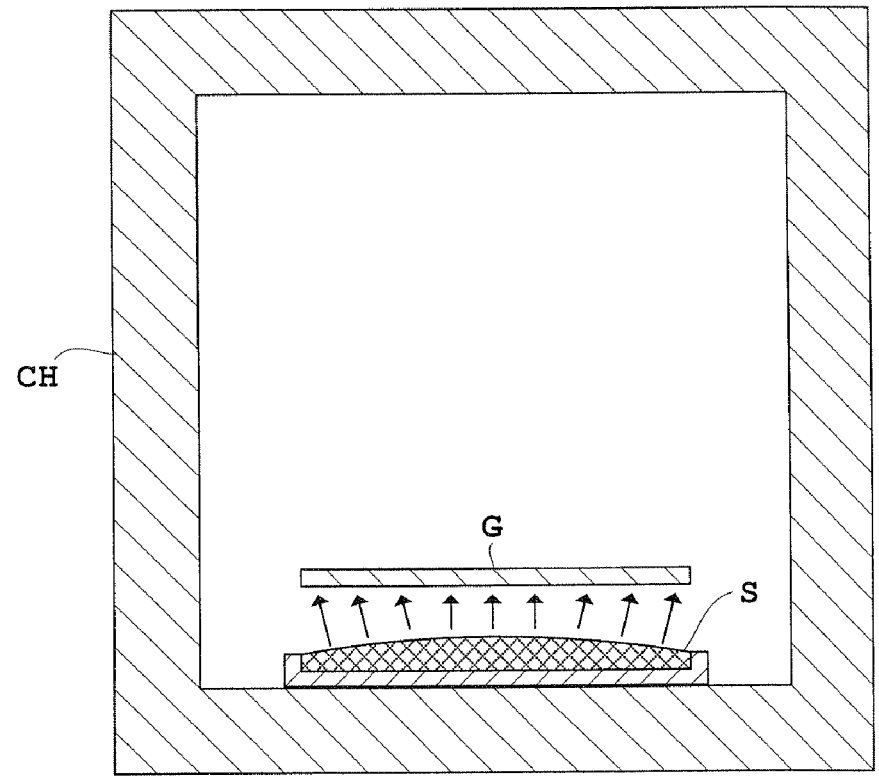

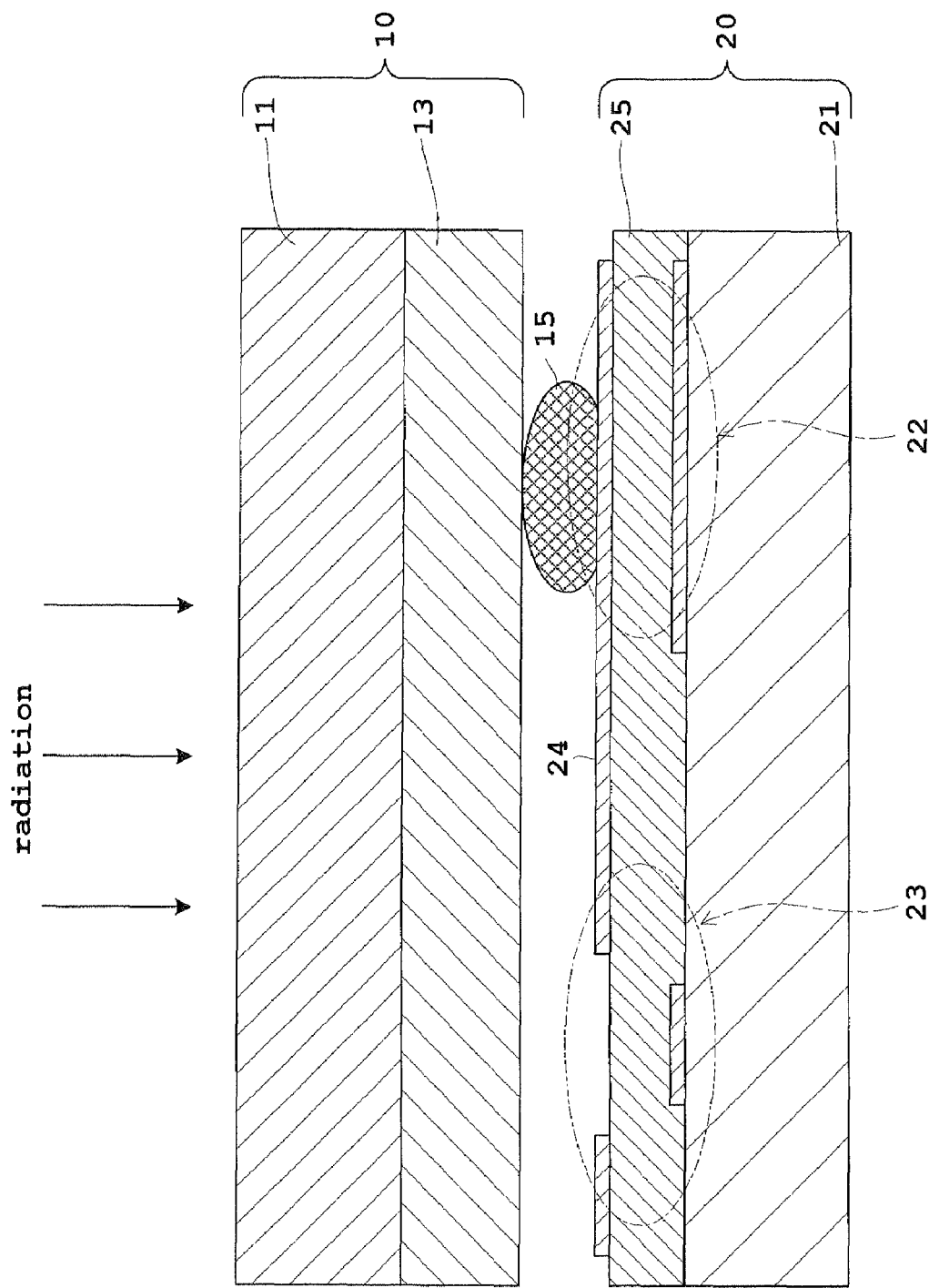

LIGHT OR RADIATION DETECTOR MANUFACTURING METHOD

TECHNICAL FIELD

This invention relates to a light or radiation detector manufacturing method for use in the medical, industrial, nuclear and other fields.

BACKGROUND ART

A light or radiation detector has a semiconductor for generating electric charges in response to incident light or radiation, and a support substrate for supporting the semiconductor laminated thereon. Radiation (e.g. X-ray) detectors include an "indirect conversion type" detector which once generates light upon incidence of radiation (e.g. X rays) and generates electric charges from the light, thus detecting the radiation by converting the radiation indirectly into the electric charges, and a "direct conversion type" detector which generates electric charges upon incidence of radiation, thus detecting the radiation by converting the radiation directly into the electric charges. In the "direct conversion type" detector, the semiconductor which generates electric charges is a radiation sensitive semiconductor.

As this radiation sensitive semiconductor, films of CdTe, ZnTe, $HgI_2$, $PbI_2$, PbO, $BiI_3$, TlBr, Se, Si, GaAs, InP and so on formed by physical vapor deposition (PVD) are used or considered. As film forming methods for high sensitivity materials such as CdTe, sputtering, CVD, sublimation method and chemical deposition method are known, and polycrystal films are obtained by all these methods. The detection characteristics of polycrystal films with respect to light or radiation are greatly dependent on crystalline morphology of the films, and thus greatly dependent on film forming conditions.

Incidentally, physical vapor deposition includes a method called "proximity sublimation method". This proximity sublimation method is a method in which a deposition source and a supporting substrate which is an object for having a semiconductor formed on its surface are placed close to each other, and the semiconductor is formed of a sublimate of the source on the surface of the supporting substrate. Since the source is in proximity in this proximity sublimation method, a semiconductor of large area can be formed relatively easily.

However, with semiconductor films formed by physical vapor deposition represented by these methods, a film formed adjacent a substrate interface at an early stage from a surface layer of the source has poor crystallinity. It has been confirmed experimentally that, with a CdZnTe film formed by the proximity sublimation method in particular, the film formed on the substrate at an early stage from a surface layer of the source has poor crystallinity, becoming a cause of deteriorating detection characteristic.

So, there is a technique of forming a semiconductor film on the surface of the substrate after cutting the film formed by vapor deposition at an early stage, by providing a shielding device between the deposition source and the film forming surface of the substrate (see Nonpatent Document 1, for example). According to this technique, since impurities are mixed in the source in an initial state, the shield is provided at an early stage to cut the defective film to be formed by vapor deposition at the early stages. Therefore, by removing the shield subsequently, the semiconductor film formed after the removal has high quality, thereby improving detection characteristics.

[Nonpatent Document 1]
"Handbook of Thin Film Formation/Evaluation and its Application Technology" by Yasuo Nakai, Fuji Technosystem, p. 250.

DISCLOSURE OF THE INVENTION

Problem to be Solved by the Invention

Although a light or radiation detector having a high-quality semiconductor is realizable with such a shielding technique, it is desired to realize a light or radiation detector having a high-quality semiconductor also with a technique other than the technique described above.

This invention has been made in view of such a situation, and its object is to provide a light or radiation detector manufacturing method, which can realize a detector having a high-quality semiconductor.

Means for Solving the Problem

To fulfill this object, this invention provides the following construction.

A method of manufacturing a light or radiation detector having a polycrystalline semiconductor film for generating electric charges upon incidence of light or radiation, and a supporting substrate for supporting the polycrystalline semiconductor film to be laminated thereon, crystal grains of the semiconductor film being formed continuously and without crystal grain boundaries present in a direction of thickness, wherein at a time of forming the semiconductor film, the semiconductor film is formed in a predetermined thickness on a dummy substrate by vapor deposition, subsequently the dummy substrate is replaced with the supporting substrate, and the semiconductor film continues to be formed on the supporting substrate by vapor deposition, the semiconductor film being formed by a proximity sublimation method which places, close to each other, a deposition source and the supporting substrate or a dummy substrate to deposit sublimate of the deposition source on a surface of the substrate, thereby forming the semiconductor film that should be on the supporting substrates or the semiconductor film that should be formed on the dummy substrate.

According to the light or radiation detector of this invention, when forming a polycrystalline semiconductor film, the semiconductor film is formed in a predetermined thickness on a dummy substrate by vapor deposition, subsequently the dummy substrate is replaced with a supporting substrate, and the semiconductor film continues to be formed on the supporting substrate by vapor deposition. The time when forming the semiconductor film in the predetermined thickness on the dummy substrate by vapor deposition is an initial state, and a defective film inevitably to be formed is formed on the dummy substrate. Subsequently, a semiconductor film not in the initial state is formed on the supporting substrate put as replacement. This realizes a detector having the semiconductor of higher quality than in the prior art. The semiconductor film manufactured in this way has crystal grains of the semiconductor film formed continuously without crystal grain boundaries present in the direction of thickness.

This invention employs, among such vapor deposition techniques, a proximity sublimation method which places, close to each other, a deposition source and the supporting substrate or the dummy substrate, and deposit sublimate of the deposition source on the surface of the substrate. That is, in the proximity sublimation method, the semiconductor film is formed on the supporting substrate or the dummy substrate.

Since the deposition source is in proximity in this proximity sublimation method, the semiconductor film can be formed to have a large area relatively easily.

In one example of the invention relating to the method of manufacturing a light or radiation detector noted above, the dummy substrate is formed of the same material as the supporting substrate for replacement. In another example, the dummy substrate is formed in the same size as the supporting substrate for replacement.

In one example of the invention relating to the method of manufacturing a light or radiation detector noted above, a common electrode for bias voltage application is used as the supporting substrate.

In one example of the invention relating to the method of manufacturing a light or radiation detector noted above, the supporting substrate and the dummy substrate are placed in one chamber beforehand, and the supporting substrate is retracted to a retracting place in the chamber not affecting the semiconductor film formation when forming the semiconductor film on the dummy substrate.

Effects of the Invention

According to the light or radiation detector manufacturing method of this invention, when forming a semiconductor, the semiconductor is formed in a predetermined thickness on a dummy substrate by vapor deposition, subsequently the dummy substrate is replaced with a supporting substrate, and the semiconductor continues to be formed on the supporting substrate by vapor deposition, thereby realizing a detector having the semiconductor of higher quality than in the prior art. The semiconductor manufactured in this way is formed continuously at least in a direction of thickness.

BRIEF DESCRIPTION OF THE DRAWINGS

FIGS. 3(a) and (b) are views schematically depicting formation of a semiconductor by a proximity sublimation method according to the embodiment;

FIG. 7 is a schematic sectional view of a flat panel X-ray detector (FPD) of the direct conversion type according to a further modified embodiment

DESCRIPTION OF REFERENCES

Figure 1:
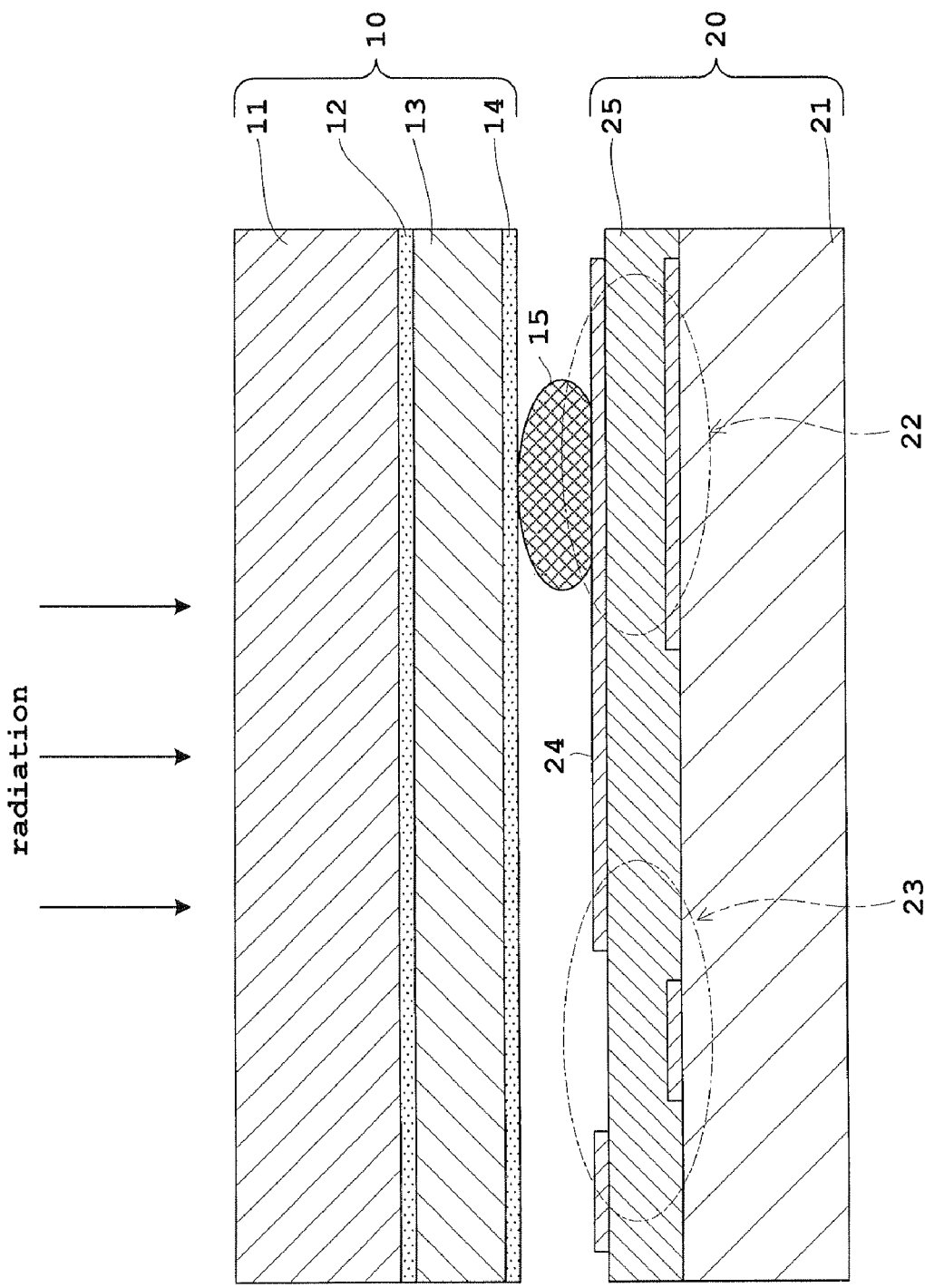
FIG. 1 is a schematic sectional view of a flat panel X-ray detector (FPD) of the direct conversion type according to an embodiment.

11 . . . (conductive) graphite substrate
13 . . . (radiation sensitive) semiconductor
20 . . . active matrix substrate
22 . . . charge storage capacity elements
23 . . . TFT (thin film field-effect transistor) elements
26 . . . gate lines
27 . . . data lines

EMBODIMENTS

An embodiment of this invention will be described hereinafter with reference to the drawings.

Figure 2:
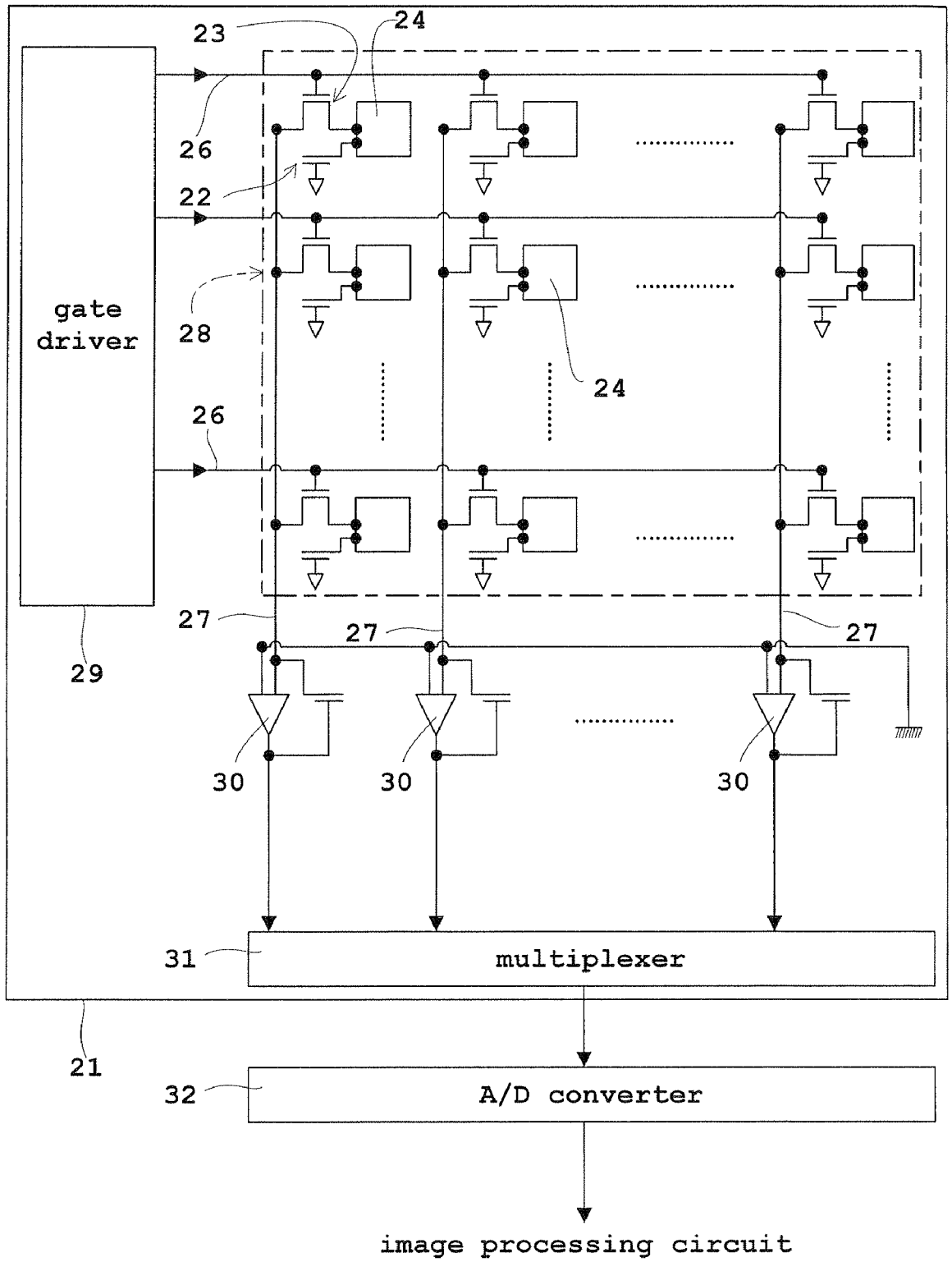
FIG. 2 is a block diagram showing an equivalent circuit of an active matrix substrate of the flat panel X-ray detector (FPD)

FIG. 1 is a schematic sectional view of a direct conversion type flat panel X-ray detector (hereinafter abbreviated as "FPD" where appropriate) according to an embodiment. FIG. 2 is a block diagram showing an equivalent circuit of an active matrix substrate of the flat panel X-ray detector (FPD). The flat panel X-ray detector (FPD) will be described as an example of radiation detector in this embodiment.

As shown in FIG. 1, the FPD in this embodiment includes a detector substrate 10 and an active matrix substrate 20. The detector substrate 10 has a conductive graphite substrate 11, a radiation sensitive semiconductor 13 and two carrier-selective blocking layers 12 and 14. The active matrix substrate 20 has charge storage capacity elements 22, TFT (thin film field-effect transistor) elements 23 and picture electrodes 24 in pattern formation on a glass substrate 21. Bump electrodes 15 are interposed between the detector substrate 10 and active matrix substrate 20. The picture elements 24 are individually connected to the carrier-selective blocking layer 14 through the bump electrodes 15. The conductive graphite substrate 11 corresponds to the supporting substrate in this invention. The radiation sensitive semiconductor 13 corresponds to the semiconductor film in this invention. The active matrix substrate 20 corresponds to the active matrix substrate in this invention. The charge storage capacity elements 22 correspond to the charge storage capacity elements in this invention. The TFT elements 23 correspond to the switching elements in this invention.

As shown in FIG. 1, the detector substrate 10 and active matrix substrate 20 are pasted together through the bump electrodes 15, with the active matrix substrate 20 having the semiconductor 13 laminated on the incidence side.

The semiconductor 13 generates electric charges upon incidence of radiation (X rays in the embodiment). The conductive graphite substrate 11 supports the semiconductor 13 for lamination, and has a function as a common electrode for bias voltage application.

The charge storage capacity elements 22 accumulate the electric charges generated by the semiconductor 13. The TFT elements 23 read the accumulated electric charges by switching. The glass substrate 21 has, on its surface, the charge storage capacity elements 22, TFT elements 23 and picture electrodes 24 in pattern formation, and an insulating layer 25 laminated to interpose between electrodes of the charge storage capacity elements 22 and gate electrodes/source-drain electrodes. The electrodes on the incidence side of the charge storage capacity elements 22 are the picture electrode 24, and part thereof form the source electrodes of TFT elements 23. That is, the picture electrodes 24 of the charge storage capacity elements 22 are connected to the source electrodes of TFT elements 23. The gate electrodes of TFT elements 23 are connected to gate lines 26 (see FIG. 2). The drain electrodes of TFT elements 23 are connected to data lines 27 (see FIG. 2).

As shown in FIG. 2, electrode wiring like these gate lines 26 and data lines 27, TFT elements 23 and charge storage capacity elements 22 are set to a two-dimensional matrix arrangement. Specifically, the gate lines 26 are arranged to form rows, while the data lines 27 are arranged to form columns. The gate lines 26 and data lines 27 extend perpendicular to each other. By allotting pixels according to the two-dimensional matrix arrangement, charge information detected with the radiation is convertible to pixel values. That is, a pixel is allotted to each picture electrode 24 of the charge storage capacity elements 22. Therefore, a pixel area 28 corresponds to an area in which all the picture electrodes 24 can be formed. The gate lines 26 and data lines 27 correspond to the electrode wiring in this invention.

Besides the charge storage capacity elements 22 and TFT elements 23 noted above, the glass substrate 21 has, on the surface thereof, a gate driver 29, charge-to-voltage converting amplifiers 30 and a multiplexer 31 in pattern formation around the pixel area 28. An analog-to-digital converter 32 also is disposed around the pixel area 28, which is connected via a substrate different from the active matrix substrate 20. Part or all of the gate driver 29, charge-to-voltage converting amplifiers 30, multiplexer 31 and analog-to-digital converter 32 may be built into the active matrix substrate 20.

In time of X-ray detection by the FPD, a bias voltage is applied from a bias voltage source (not shown) to the graphite substrate 11 acting as the common electrode for bias voltage application. With the bias voltage applied, electric charges are generated in the radiation sensitive semiconductor 13 upon incidence of the radiation (X rays in the embodiment). These electric charges generated are once collected through the bump electrodes 15 by the picture electrodes 24 which are also collecting electrodes. The collected electric charges are fetched as radiation detection signals (X-ray detection signals in the embodiment) from the respective picture electrodes 24.

Specifically, the electric charges collected by the picture electrodes 24 are once stored in the charge storage capacity elements 22. Then, the gate driver 29 successively applies read signals via the gate lines 26 to the gate electrodes of the respective TFT elements 23. With the read signals applied, the TFT elements 23 receiving the read signals are switched from off to on-state. As the data lines 27 connected to the drain electrodes of the switched TFT elements 23 are successively switched on by the multiplexer 31, the electric charges stored in the charge storage capacity elements 22 are read from the TFT elements 23 through the data lines 27. The electric charges read are amplified by the charge-to-voltage converting amplifiers 30 and transmitted from the multiplexer 31, as radiation detection signals (X-ray detection signals in the embodiment) from the respective picture electrodes 24, to the analog-to-digital converter 32 for conversion from analog values to digital values.

Where the FPD is provided for a fluoroscopic apparatus, for example, X-ray detection signals are transmitted to an image processing circuit, disposed at a subsequent stage, for image processing to output a two-dimensional fluoroscopic image or the like. Each of the picture electrodes 24 in the two-dimensional matrix arrangement corresponds to each pixel in the radiographic image (two-dimensional fluoroscopic image here). By fetching the radiation detection signals (X-ray detection signals in the embodiment), it becomes possible to create a radiographic image (two-dimensional fluoroscopic image here) according to a two-dimensional intensity distribution of the radiation. In other words, the FPD in this embodiment is a two-dimensional array type radiation detector for detecting a two-dimensional intensity distribution of radiation (X rays in the embodiment).

An electric charge consists of a pair of electron-hole. The semiconductor 13 and charge storage capacity elements 22 are connected in series through the bump electrodes 15. Thus, when negative bias voltage (−Vh) is applied to the graphite substrate 11, for example, the electric charges generated in the semiconductor 13 have electrons moving toward the bump electrodes 15 and holes toward the graphite substrate 11. As a result, the electric charges are stored in the charge storage capacity elements 22. On the other hand, leakage electric charges not contributing to sensitivity are easily injected into the semiconductor 13. When negative bias voltage is applied to the graphite substrate 11, electrons are easily injected from the graphite substrate 11 into the semiconductor 13, and holes are easily injected from the active matrix substrate 20 to the semiconductor 13 through the bump electrodes 15. As a result, leak currents increase.

Thus, in this embodiment, in order to reduce leak currents due to injection of the electric charges, as shown in FIG. 1, the carrier-selective blocking layer 12 is formed between the graphite substrate 11 and semiconductor 13, while the carrier-selective blocking layer 14 is formed between the semiconductor 13 and active matrix substrate 20. When negative bias voltage is applied to the graphite substrate 11, the blocking layer 12 functions as an electron blocking layer which blocks injection of electrons from the graphite substrate 11, while the blocking layer 14 functions as a hole blocking layer which blocks injection of holes from the active matrix substrate 20.

In this way, leak currents can be reduced by forming the carrier-selective blocking layers 12 and 14. The carrier selectivity herein refers to a remarkable difference in contribution to charge transfer action between electrons and holes which are charge transfer media (carriers) in a semiconductor.

The following modes are cited as ways of combining the semiconductor 13 and carrier-selective blocking layers 12 and 14. Where positive bias voltage is applied to the graphite substrate 11, a material with a large contribution of electrons is used for the blocking layer 12. This blocks injection of holes from the graphite substrate 11, thereby reducing leak currents. A material with a large contribution of holes is used for the blocking layer 14. This blocks injection of electrons from the active matrix substrate 20, thereby reducing leak currents.

Conversely, where negative bias voltage is applied to the graphite substrate 11, a material with a large contribution of holes is used for the blocking layer 12. As noted above, this blocks injection of electrons from the graphite substrate 11, thereby reducing leak currents. A material with a large contribution of electrons is used for the blocking layer 14. This blocks injection of holes from the active matrix substrate 20, thereby reducing leak currents.

Among semiconductors used for the blocking layers 12 and 14, those having a large contribution of electrons include polycrystalline semiconductors such as $CeO_2$, CdS, CdSe, ZnSe and ZnS which are n-type semiconductor, and amorphous objects such as amorphous Se doped with alkali metal, As or Te to have a reduced contribution of holes.

Those having a large contribution of holes include polycrystalline semiconductors such as ZnTe which is a p-type semiconductor, and amorphous objects such as amorphous Se doped with halogen to have a reduced contribution of electrons.

Further, in the case of $Sb_2S_3$, CdTe, CdZnTe, $PbI_2$, $HgI_2$, TlBr, and non-dope amorphous Se or Se compound, there are both those having a large contribution of electrons and those having a large contribution of holes. In these cases, it is possible, by adjusting film forming conditions, to select and form those having a large contribution of electrons and those having a large contribution of holes.

Where, as in this embodiment, negative bias voltage is applied to the graphite substrate 11, in order that the blocking layer 12 functions as an electron blocking layer for blocking injection of electrons from the graphite substrate 11, the blocking layer 12 is formed of ZnTe having a large contribution of holes, and in order that the blocking layer 14 functions as a hole blocking layer for blocking injection of holes from the active matrix substrate 20, the blocking layer 14 is formed of ZnS having a large contribution of electrons.

The active matrix substrate 20, as shown in FIGS. 1 and 2, has the above-noted charge storage capacity elements 22, TFT elements 23, picture electrodes 24, insulating layer 25, gate lines 26, data lines 27, gate driver 29, charge-to-voltage converting amplifiers 30 and multiplexer 31 formed in patterns on the glass substrate 21 by screen printing, for example. The bump electrodes 15 are formed by screen printing or stud bump process. The thickness of the glass substrate 21 is about 0.5 mm-1.5 mm, for example.

The thickness of the semiconductor 13 is usually a thick film of about 0.5 mm-1.5 mm (about 0.4 mm in this embodiment), its area is about 20 cm-50 cm long and about 20 cm-50 cm wide, for example. The radiation sensitive semiconductor 13, preferably, is one of amorphous semiconductors such as of high-purity amorphous selenium (a-Se), selenium or selenium compound doped with alkali metal such as Na, halogen such as Cl, As or Te, and non-selenic polycrystalline semiconductors such as CdTe, CdZnTe, $PbI_2$, $HgI_2$ and TlBr. It is preferred in particular to form the semiconductor 13 from CdTe, ZnTe, $HgI_2$, $PbI_2$, PbO, $BiI_3$, TlBr, Se, Si, GaAs, InP, or crystalline mixtures (mixed crystals) containing these.

The semiconductor 13 using CdTe, ZnTe, $HgI_2$, $PbI_2$, PbO, $BiI_3$, TlBr or GaAs can realize a detector of high sensitivity and good noise resistance. The use of Se can easily provide a uniform and large detector. The use of Si or InP can provide a detector of high energy resolution. When CdZnTe is used as the semiconductor 13, since CdZnTe is a crystalline mixture (mixed crystal) of CdTe and ZnTe, a detector of high sensitivity and good noise resistance can be obtained.

The graphite substrate 11 is a carbon having conductivity. Since the graphite substrate 11 has a function as a common electrode for bias voltage application, the common electrode may be formed of a material other than graphite. The common electrode may be formed of metal such as aluminum or MgAg. The common electrode may be formed of an electrode substrate such as an alumina substrate having an electrode such as ITO (transparent electrode) formed on its surface. When forming the common electrode of metal such as aluminum or MgAg, the thickness of the common electrode is a thin film of about 0.1 μm. When forming the common electrode of graphite substrate 11 or electrode substrate, the thickness of the common electrode is a thin film of about 2 mm. The thickness of blocking layers 12 and 14 is about 200 nm, and its resistivity is at the level of $10^{11}$ Ω·cm.

Next, a method of manufacturing the FPD will be described. On the side of the active matrix substrate 20, as noted above, the charge storage capacity elements 22, TFT elements 23, picture electrodes 24, insulating layer 25, gate lines 26, data lines 27, gate driver 29, charge-to-voltage converting amplifiers 30 and multiplexer 31 are formed in patterns on the glass substrate 21 by screen printing, for example. More particularly, as in the case of active matrix substrates for liquid crystal displays, the charge storage capacity element 22 and TFT elements 23 are formed on the surface of the glass substrate 21 using the semiconductor thin film manufacturing technique or microfabrication technique, and the surface except connections with the picture electrodes 24 is coated with the insulating layer 25. The peripheral circuits around the pixel area 28, such as the gate driver 29, charge-to-voltage converting amplifiers 30 and multiplexer 31 are formed of semiconductor integrated circuits such as of silicon, and are respectively connected to the gate lines 26 and gate lines 27 through anisotropic conductive film (ACF), for example.

On the side of the detector substrate 10 side, the following formation is made. The blocking layer 12 is laminated on the graphite substrate 11. Physical vapor deposition (PVD), chemical deposition method, electro deposition or the like may be used to form the blocking layer 12 and also blocking layer 14. The graphite substrate 11 with the blocking layer 12 formed thereon is referred to as graphite substrate G as shown in FIG. 3(b). The semiconductor 13 is formed on this graphite substrate G by proximity sublimation method as shown in FIG. 3(b). The proximity sublimation method shown in FIG. 3 will be described in detail hereinafter. After forming the semiconductor 13, the surface is planarized by polishing such as chemical mechanical polishing (CMP). Then, the blocking layer 14 is formed.

The proximity sublimation method according to this embodiment will be described with reference to FIG. 3. As shown in FIG. 3(a), a deposition source S of CdZnTe and a dummy substrate D are placed close to each other in a chamber CH degassed to a vacuum. The distance of proximity in this case is variable with the material to be formed, film forming conditions and so on, which is in a range of about 2 mm-several millimeters. The dummy substrate D, preferably, is formed of the same material and in the same size as the common electrode to replace it. In this embodiment, the common electrode is graphite, and therefore the dummy substrate D is formed of graphite.

When the source S is heated by lamp heating, the solid of the source S will sublimate and vaporizes. The vaporized material adheres to and solidifies again on the dummy substrate D, to be formed on the surface of the dummy substrate D. After forming CdZnTe in a predetermined thickness on the dummy substrate D, as shown in FIG. 3(b), the dummy substrate D is replaced with the graphite substrate G, and CdZnTe continues to be formed on the graphite substrate G.

When replacing the dummy substrate D with the graphite substrate G, the vacuum state in the chamber CH cannot be maintained, but this causes no problem for formation of CdZnTe. It is possible to place also the graphite substrate with the dummy substrate in the chamber CH beforehand, retract the graphite substrate to a place not affecting the formation of CdZnTe, and transport the graphite substrate close to the source in the chamber CH at a time of change.

According to the above FPD manufacturing method in this embodiment, when forming the semiconductor 13, the semiconductor is formed in a predetermined thickness on the dummy substrate D by vapor deposition, subsequently the dummy substrate D is replaced with the graphite substrate G which is the supporting substrate, and the semiconductor continues to be formed on the graphite substrate G by vapor deposition. The time when forming the semiconductor in the predetermined thickness on the dummy substrate D by vapor deposition is an initial state, and the defective film inevitably to be formed is formed on the dummy substrate D. Subsequently, a semiconductor not in the initial state is formed on the graphite substrate D put as replacement. This realizes a detector having the semiconductor 13 of higher quality than in the prior art. The semiconductor 13 manufactured in this way is formed continuously at least in the direction of thickness. The detector having such semiconductor 13 has improved detection characteristics.

Figure 4:
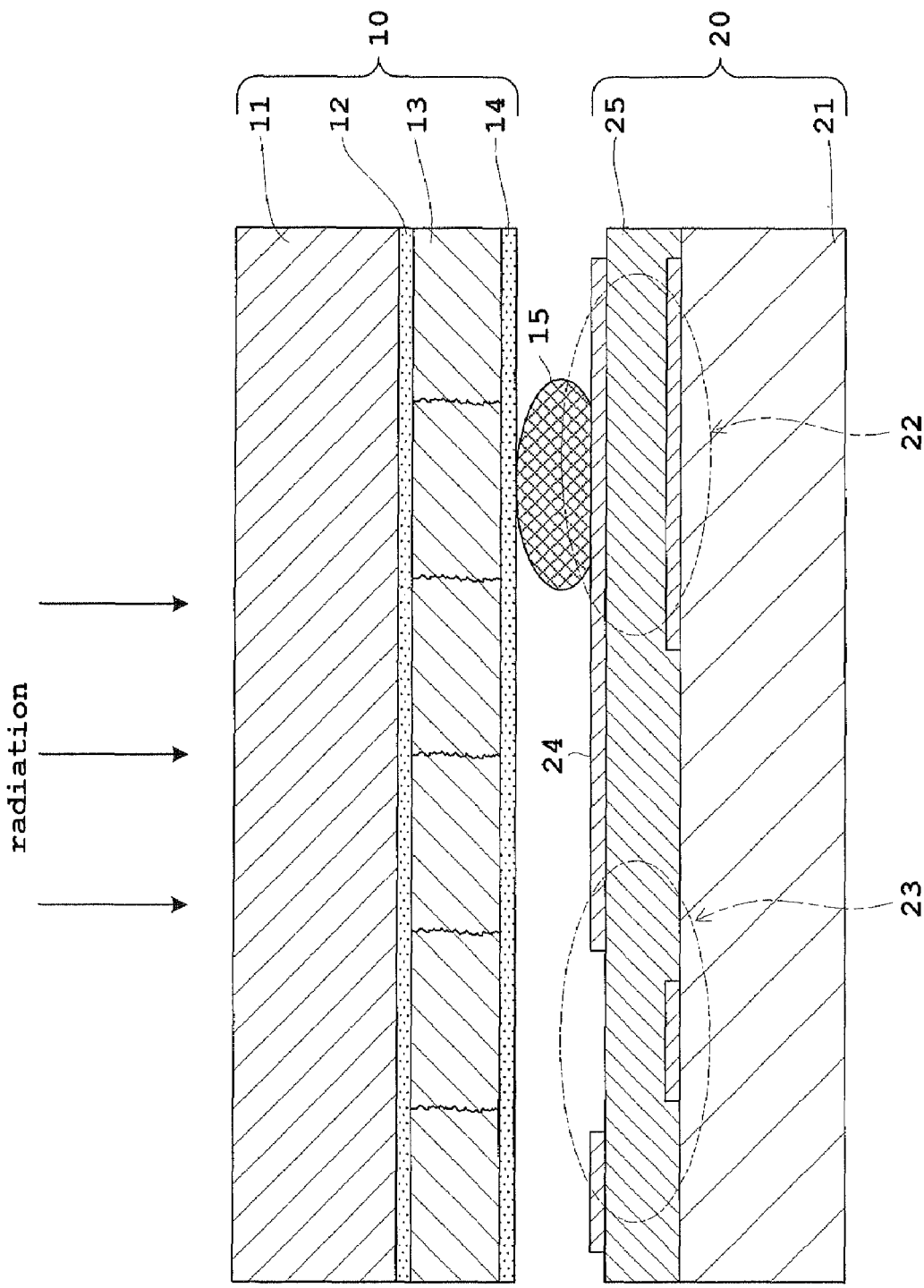
FIG. 4 is a schematic sectional view of a flat panel X-ray detector (FPD) with a semiconductor formed intermittently by grain boundaries in a sideways direction perpendicular to a direction of thickness.

As the cases of the semiconductor 13 being formed continuously at least in the direction of thickness, there is a case, as shown in FIG. 1, for example, where the semiconductor 13 is formed continuously also in a sideways direction perpendicular to the direction of thickness, and a case, as shown in FIG. 4, where the semiconductor 13 is formed intermittently by grain boundaries in the sideways direction perpendicular to the direction of thickness. In these cases, the crystal grain diameter in the sideways direction can be controlled by temperature of the graphite substrate 11. The higher temperature results in the larger crystal grain diameter. Therefore, the temperature is raised in order to realize the semiconductor 13 formed continuously also in the sideways direction perpendicular to the direction of thickness as shown in FIG. 1. The temperature is lowered in order to realize the semiconductor 13 formed intermittently by grain boundaries in the sideways direction perpendicular to the direction of thickness as shown in FIG. 4.

In this embodiment, the proximity sublimation method is employed as physical vapor deposition. In the proximity sublimation method, the deposition source and the graphite substrate 11 which is an object for forming the semiconductor 13 on the surface thereof are placed close to each other, and the semiconductor 13 is formed of the sublimate of the source on the surface of the graphite substrate 11. Since the source is in proximity in this proximity sublimation method, the semiconductor 13 can be formed to have a large area relatively easily.

This invention is not limited to the above embodiment, but may be modified as follows:

(1) The foregoing embodiment is directed to the direct conversion type, but is applicable also to the indirect conversion type. In this case, the semiconductor is formed of the photoelectric conversion type (e.g. photodiode) which generates electric charges upon incidence of light generated by radiation incidence. The FPD has a scintillator laminated on an incidence surface of the photodiode. In this case, the scintillator and the like once generate light upon incidence of radiation, and the photodiode generates electric charges from the light. Thus, the FPD is the "indirect conversion type" which detects radiation by converting the radiation indirectly into electric charges.

(2) The foregoing embodiment is directed to a radiation detector, but is applicable also to a light detector. In this case, the semiconductor is formed of the light-sensitive type that generates electric changes upon incidence of light.

(3) In the foregoing embodiment, the radiation detector represented by a flat panel X-ray detector is the two-dimensional array type. The radiation detector of this invention may be the one-dimensional array type having picture electrodes formed in a one-dimensional matrix arrangement, or the non-array type having only one electrode for fetching radiation detection signals.

(4) In the foregoing embodiment, an X-ray detector has been described as an example of radiation detectors. This invention is applicable also to a radiation detector (e.g. gamma ray detector) for detecting radiation other than X rays (e.g. gamma rays).

(5) In the foregoing embodiment, negative bias voltage is applied to the common electrode represented by the graphite substrate 11, with the blocking layer 12 acting as electron blocking layer, and the blocking layer 14 acting as a hole blocking layer. When positive bias voltage is applied, materials of the blocking layers 12 and 14 may be selected so that the blocking layer 12 acts as a hole blocking layer, and the blocking layer 14 as an electron blocking layer.

Figure 5:
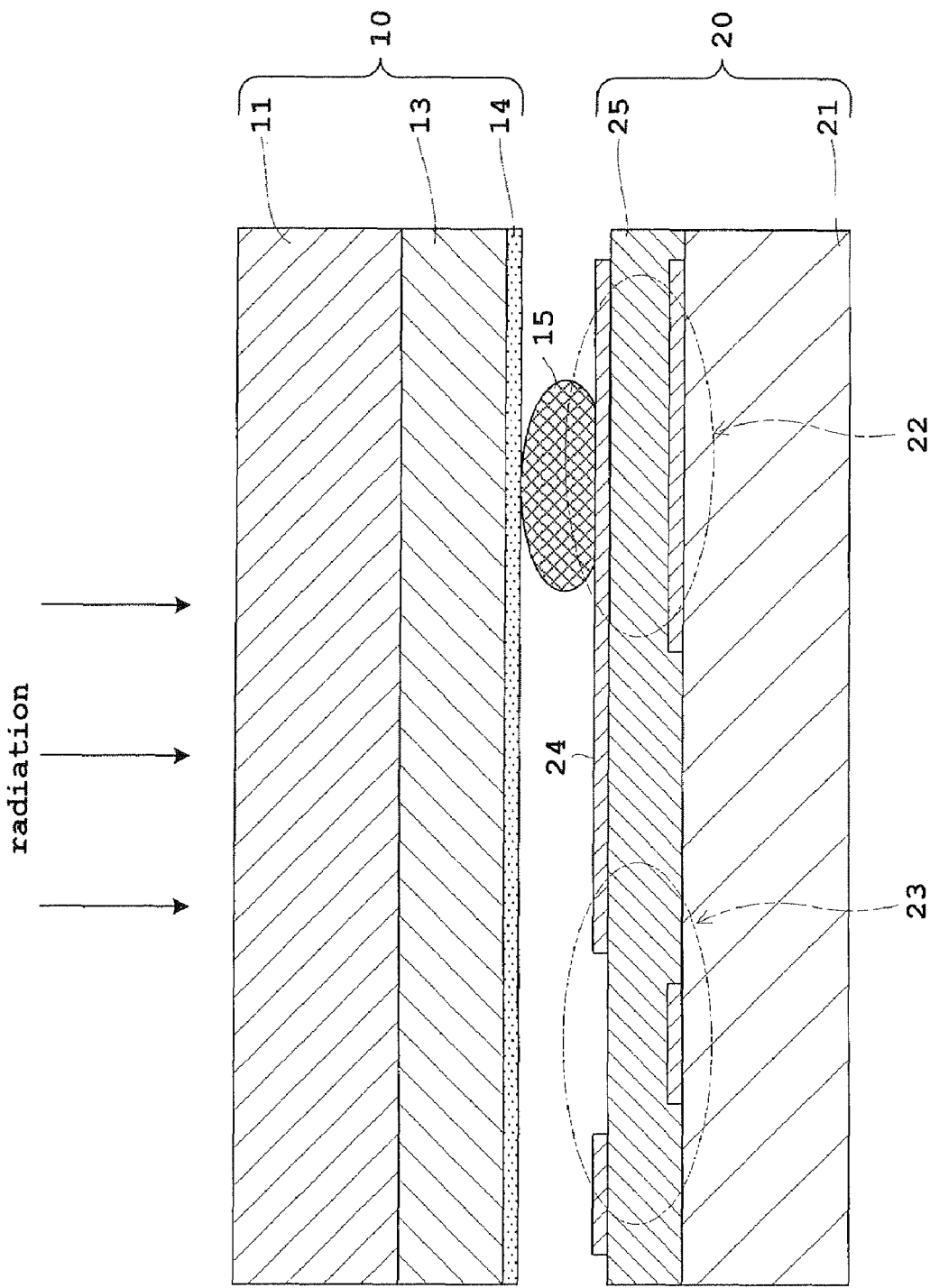
FIG. 5 is a schematic sectional view of a flat panel X-ray detector (FPD) of the direct conversion type according to a modified embodiment.
Figure 6:
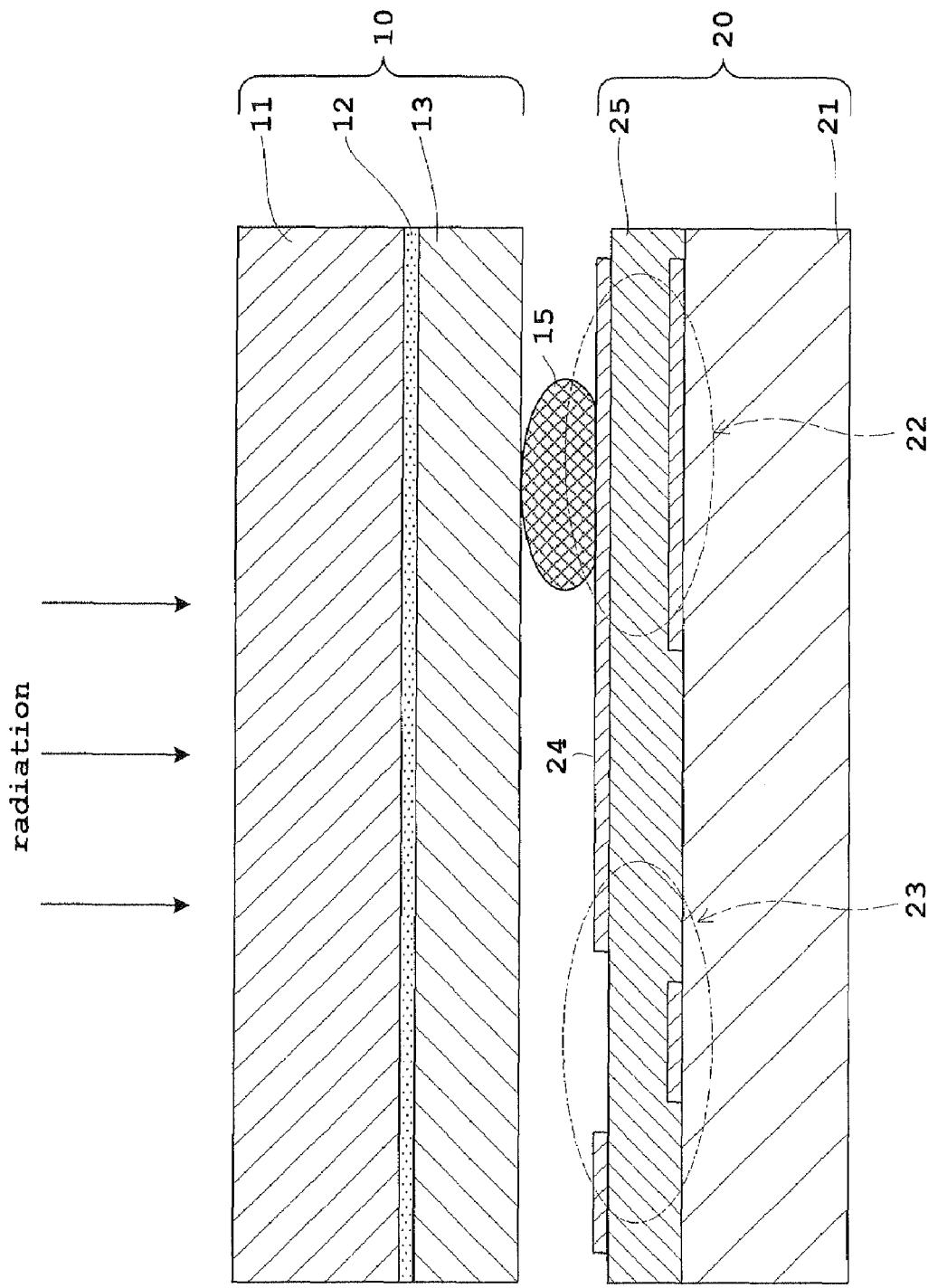
FIG. 6 is a schematic sectional view of a flat panel X-ray detector (FPD) of the direct conversion type according to a further modified embodiment.

(6) In the foregoing embodiment, the carrier selective blocking layer 12 is formed between the graphite substrate 11 and semiconductor 13, and the carrier selective blocking layer 14 between the semiconductor 13 and active matrix substrate 20. At least either between the graphite substrate 11 and semiconductors 13 or between the semiconductor 13 and active matrix substrate 20, a blocking layer may be provided for blocking injection of electric charges to the semiconductor 13, or no blocking layer may be provided. The invention is not limited to any particular arrangement of blocking layers 12 and 14. For example, the blocking layer 12 may be omitted from between the graphite substrate 11 and semiconductor 13 and, as shown in FIG. 5, only the blocking layer 14 may be formed between the semiconductor 13 and active matrix substrate 20. The blocking layer 14 may be omitted from between the semiconductor 13 and active matrix substrate 20 and, as shown in FIG. 6, only the blocking layer 12 may be formed between the graphite substrate 11 and semiconductor 13. As shown in FIG. 7, no blocking layer may be provided.

(7) The foregoing embodiment shows a structure having the detector substrate 10 and active matrix substrate 20 pasted together through the bump electrodes 15. The structure may be modified to have the blocking layer 14, semiconductor 13, blocking layer 12, and graphite substrate 11 laminated in order on the active matrix substrate 20.

(8) In the foregoing embodiment, the proximity sublimation method has been described as an example of physical vapor deposition. The semiconductor may be formed by other types of vapor deposition such as sputtering, CVD, the sublimation method and chemical deposition method, for example.

The invention claimed is:

1. A method of manufacturing a light or radiation detector having a polycrystalline semiconductor film for generating electric charges upon incidence of light or radiation, and a supporting substrate for supporting the polycrystalline semiconductor film to be laminated thereon, crystal grains of the semiconductor film being formed continuously and without crystal grain boundaries present in a direction of thickness, wherein at a time of forming the semiconductor film, the semiconductor film is formed in a predetermined thickness on a dummy substrate by vapor deposition, subsequently the dummy substrate is replaced with the supporting substrate, and the semiconductor film continues to be formed on the supporting substrate by vapor deposition, the semiconductor film being formed by a proximity sublimation method which places, close to each other, a deposition source and the supporting substrate or a dummy substrate to deposit sublimate of the deposition source on a surface of the substrate, thereby forming the semiconductor film that should be on the supporting substrates or the semiconductor film that should be formed on the dummy substrate.

2. The method of manufacturing a light or radiation detector according to claim 1, wherein the dummy substrate is formed of the same material as the supporting substrate for replacement.

3. The method of manufacturing a light or radiation detector according to claim 1, wherein the dummy substrate is formed in the same size as the supporting substrate for replacement.

4. The method of manufacturing a light or radiation detector according to claim 1, wherein the supporting substrate is a common electrode for bias voltage application.

5. The method of manufacturing a light or radiation detector according to claim 1, wherein the supporting substrate and the dummy substrate are placed in one chamber beforehand, and the supporting substrate is retracted to a retracting place in the chamber when forming the semiconductor film on the dummy substrate.

6. The method of manufacturing a light or radiation detector according to claim 2, wherein the supporting substrate is a common electrode for bias voltage application.

7. The method of manufacturing a light or radiation detector according to claim 2, wherein the supporting substrate and the dummy substrate are placed in one chamber beforehand, and the supporting substrate is retracted to a retracting place in the chamber when forming the semiconductor film on the dummy substrate.

8. The method of manufacturing a light or radiation detector according to claim 3, wherein the supporting substrate is a common electrode for bias voltage application.

9. The method of manufacturing a light or radiation detector according to claim 3, wherein the supporting substrate and the dummy substrate are placed in one chamber beforehand, and the supporting substrate is retracted to a retracting place in the chamber when forming the semiconductor film on the dummy substrate.

10. The method of manufacturing a light or radiation detector according to claim 4, wherein the supporting substrate and the dummy substrate are placed in one chamber beforehand, and the supporting substrate is retracted to a retracting place in the chamber when forming the semiconductor film on the dummy substrate.

* * * * *